US011387588B2

(12) United States Patent
Bogen et al.

(10) Patent No.: US 11,387,588 B2
(45) Date of Patent: Jul. 12, 2022

(54) POWER SEMICONDUCTOR MODULE WITH PRESS-FIT CONTACT ELEMENT

(71) Applicant: SEMIKRON ELEKTRONIK GMBH & CO. KG, Nuremberg (DE)

(72) Inventors: Ingo Bogen, Nuremberg (DE); Alexander Wehner, Nuremberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 17/230,649

(22) Filed: Apr. 14, 2021

(65) Prior Publication Data

US 2021/0336370 A1  Oct. 28, 2021

(30) Foreign Application Priority Data

Apr. 28, 2020  (DE) .......................... 102020111526.1

(51) Int. Cl.
*H01R 13/426* (2006.01)
*H01R 12/58* (2011.01)
*H01R 13/415* (2006.01)

(52) U.S. Cl.
CPC ......... *H01R 13/426* (2013.01); *H01R 12/585* (2013.01); *H01R 13/415* (2013.01)

(58) Field of Classification Search
CPC .......... H01R 13/426; H01R 13/415–12; H01R 13/585; H05K 2201/1059; H05K 2201/0311
See application file for complete search history.

(56) References Cited

U.S. PATENT DOCUMENTS

| 5,106,310 A | * | 4/1992 | Krajewski | .............. | H05K 3/368 |
| | | | | | 439/931 |
| 5,761,050 A | * | 6/1998 | Archer | ................. | H01R 12/523 |
| | | | | | 361/791 |
| 9,634,407 B2 | * | 4/2017 | Endo | .................... | H01R 12/585 |
| 10,720,735 B2 | | 7/2020 | Yao et al. | | |
| 2014/0199861 A1 | | 7/2014 | Mattiuzzo | | |

FOREIGN PATENT DOCUMENTS

DE    102010038727 A1    2/2012
DE    112016002302 T5    3/2018

OTHER PUBLICATIONS

DE 10 2020 111 526.1. German Search Report dated Jan. 26, 2021, 3 pages—German, 3 pages—English.

* cited by examiner

*Primary Examiner* — Vanessa Girardi

(74) *Attorney, Agent, or Firm* — Andrew F. Young; Nolte Lackenbach Siegel

(57) ABSTRACT

A power semiconductor module has a substrate, load and auxiliary connector elements, and a plastic body, which preferably is a housing or a housing frame and which has a channel. The channel being for the arrangement of a compensating portion of a press-fit contact element. The press-fit contact element has a press-fit portion, a compensating portion and a foot portion, the compensating portion being elastic in a longitudinal direction of the press-fit contact element and having at least two O-shaped sub-portions arranged in succession in the longitudinal direction and having a constriction arranged between two sub-portions.

17 Claims, 4 Drawing Sheets

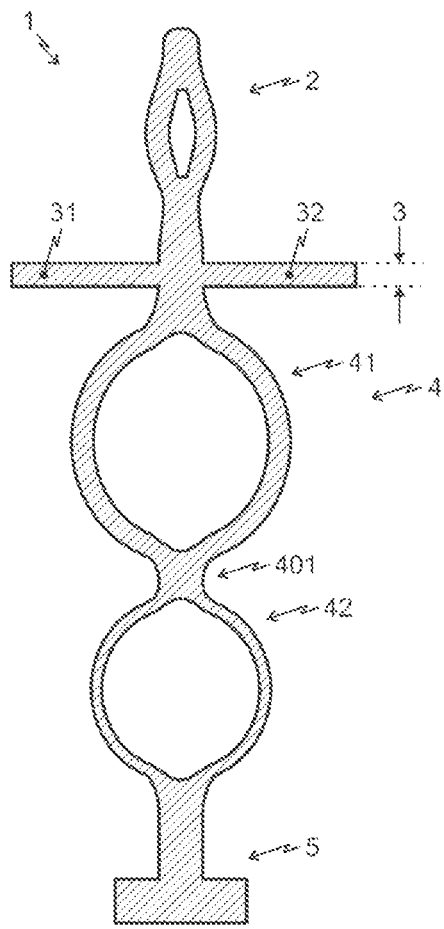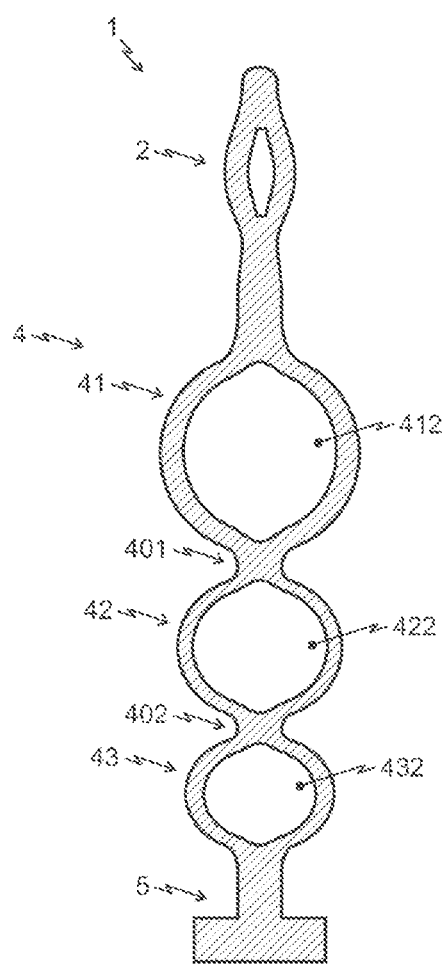
Fig. 2
Fig. 3

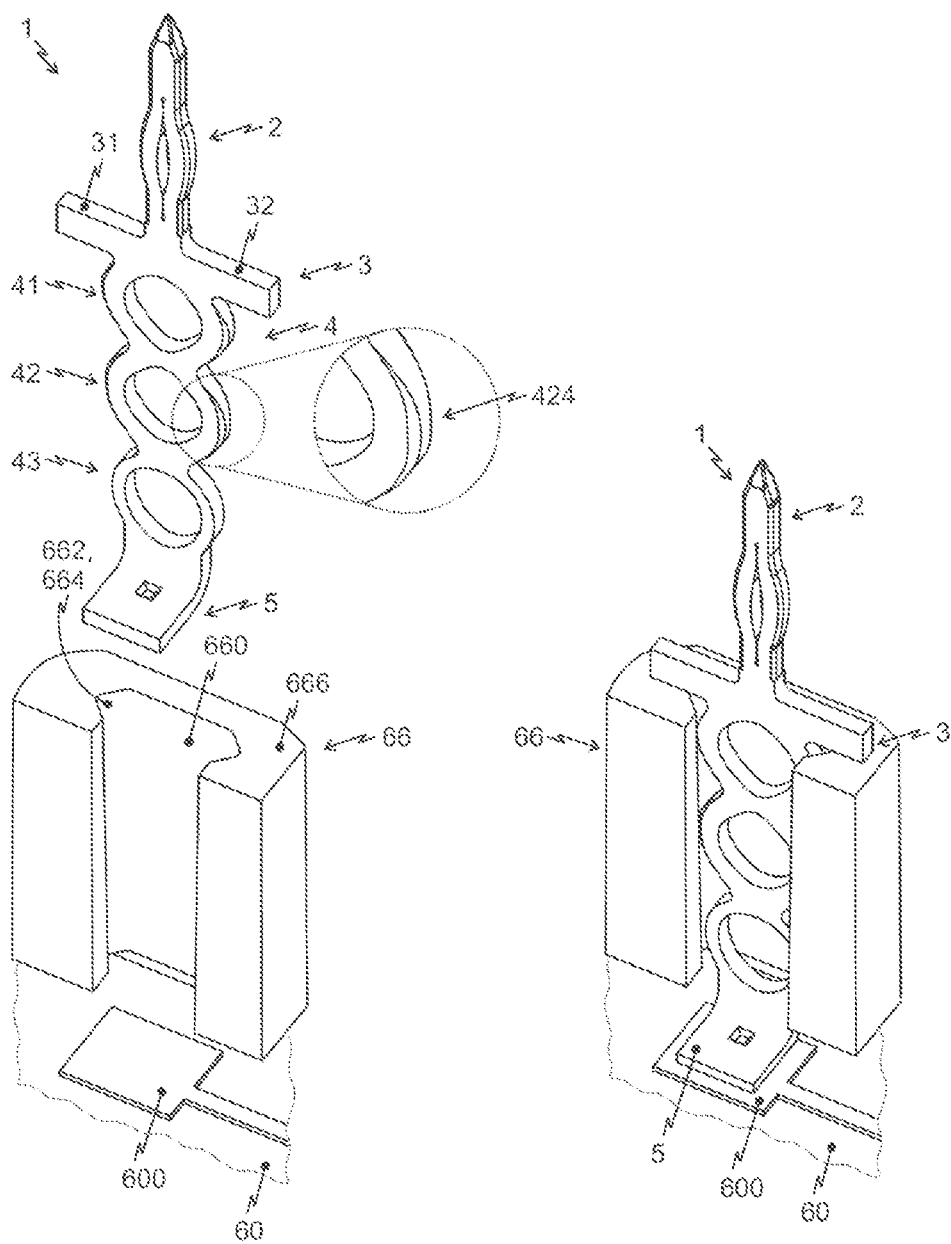

POWER SEMICONDUCTOR MODULE WITH PRESS-FIT CONTACT ELEMENT

CROSS REFERENCE TO RELATED APPLICATIONS

This application relates to and claims priority to DE 10 2020 111 526.1 filed Apr. 28, 2020, the entire contents of which are incorporated herein by reference.

FIGURE SELECTED FOR PUBLICATION

FIG. 2

BACKGROUND OF THE INVENTION

Field of the Invention

The invention describes a power semiconductor module having a substrate, power semiconductor components arranged thereon, having load connector elements, and auxiliary connector elements realized as press-fit contact elements, and having a plastic molded body that realizes a housing.

Description of the Related Art

DE 10 2010 038 727 A1 discloses as prior art a power semiconductor module having a housing element, into which terminal lugs are inserted. The terminal lugs have foot regions, on the upper sides of which bonds are to be produced. In order to fix the foot regions, press-on elements are provided, which press against the end of the terminal lug.

In principle, when press-fit contact elements are used in power semiconductor modules, it is necessary for the position of the press-fit portion, which conventionally protrudes from the housing of the power semiconductor module, to be fixed in its position perpendicular to the longitudinal direction of the press-fit contact element. In the case of a plurality of press-fit contact elements of a power semiconductor module, it is additionally necessary for the press-fit portions of at least some of the press-fit contact elements to lie on a notional line. It is additionally required for such press-fit contact elements that they have a certain spring action along their longitudinal direction.

ASPECTS AND SUMMARY OF THE INVENTION

The invention is based on the object of hereby presenting a press-fit contact element and a power semiconductor module specially adapted to the requirements in this power semiconductor module, with, in particular, the spring action in the longitudinal direction having no effect upon the position of the press-fit portion perpendicular to the longitudinal axis of the press-fit contact element.

This object is achieved according to the invention by a press-fit contact element having a press-fit portion, a compensating portion and a foot portion, the compensating portion being elastic in a longitudinal direction of the press-fit contact element, this compensating portion having at least two O-shaped sub-portions that each have a recess, and there being a first or second constriction arranged in the longitudinal direction (z) between two successively arranged sub-portions.

The foot portion in this case may be of any design. It is conventional in this case for the foot portion to be realized as a solderable or sinterable foot portion, with or without a surface element parallel to the surface, on which the foot portion is then arranged in a materially bonded manner. Alternatively, the foot portion may be realized in the shape of a pin, in particular for arrangement in a sleeve. Also, the foot portion itself may be realized as a press-fit portion, in which case both ends of the press-fit contact element are then basically identical.

The term "in succession in the longitudinal direction" is to be understood here and in the following to mean that the two sub-portions may directly adjoin one another, in particular even merge into one another. Likewise, a connection portion may also be arranged between two adjacent sub-portions.

The term O-shaped is to be understood here and in the following to mean a three-dimensional shape that is circular in the broadest sense, having two arcs and a recess formed therebetween. In particular in this case, it is advantageous if the compensating portion is flat and planar.

It may be advantageous if the recesses of two successively arranged sub-portions are completely separated from each other in the region of the first constriction arranged therebetween, or if the recesses of two successively arranged sub-portions merge into one other in the region of the second constriction.

It may also be advantageous if the width of the respective O-shaped sub-portions, as viewed from the press-fit portion, decreases monotonically or strictly monotonically in the direction of the foot portion.

It may be preferred if the outer contour of at least one O-shaped sub-portion is V-shaped.

In principle, it may be preferred if, in the case of two O-shaped sub-portions the width of at least one of the two O-shaped sub-portions is at least 25%, preferably at least 35% and in particular preferably at least 40% of the length of the compensating portion, and in the case of three O-shaped sub-portions the width of at least one of the O-shaped sub-portions is at least 20%, preferably at least 30% and in particular preferably at least 35% of the length of the compensating portion.

It may also be preferred if the width of a first constriction is at most 30%, preferably at most 25% and in particular preferably at most 20% of the length of the compensating portion, or if the width of a second constriction is at most 40%, preferably at most 35% and in particular preferably at most 30% of the length of the compensating portion.

It may furthermore be preferred if at least one of the O-shaped sub-portions has a recess whose width at its widest point is at least 60%, preferably at least 75%, of the width of the O-shaped sub-portion.

In particular, it may be advantageous if arranged between the press-fit portion and the compensating portion there is a stop portion that preferably has two laterally protruding flat stop elements, these stop elements preferably extending in the plane of the O-shaped sub-portions.

It is fundamentally advantageous if at least the compensating portion, preferably the entire press-fit contact element, is formed from a flat sheet by means of a stamping process and thus realizes two main surfaces that are arranged parallel to each other and are flat. The actual press-fit portion here has a conventional local contour that is different from this.

The object stated above is further achieved according to the invention by a power semiconductor module having a substrate, power semiconductor components arranged thereon, having load and auxiliary connector elements, and having a plastic molded body, which preferably realizes a housing or a housing frame and which has a channel, this channel being designed for the arrangement of a compensating portion of a press-fit contact element according to the above description and as a channel that is laterally closed or at least partially open on one longitudinal side.

It may be advantageous in this case if a compensating portion of a press-fit contact element is arranged in a channel.

Advantageously, at least one narrow side of the channel has, at least partially, an in particular V-shaped contour, the latter corresponding to an adapted, in particular likewise V-shaped, outer contour of an O-shaped sub-portion of a press-fit contact element. It may also be preferred in this case if the compensating portion bears against the narrow side of the channel with fewer than all the outer contours of the O-shaped sub-portions. Furthermore, an above-mentioned compensating portion of a press-fit contact element having two stop elements may be arranged in the channel, these stop elements each lying on a counter-bearing of the housing.

Clearly, unless this is excluded explicitly or per se, or contradicts the concept of the invention, the features mentioned respectively in the singular, in particular the press-fit contact element, may be present in multiple in the power semiconductor module according to the invention.

It is understood that the various designs of the invention, whether disclosed in the context of the description of the press-fit contact element or of the power semiconductor module, may be realized individually or in any combination in order to achieve improvements. In particular, the features stated and explained above and in the following may be implemented not only in the combinations specified, but also in other combinations or singly, without departure from the scope of the present invention.

Further explanations of the invention, advantageous details and features are given by the following description of the exemplary embodiments of the invention represented schematically in FIGS. 1 to 7, or of respective pans thereof.

The above and other aspects, features, objects, and advantages of the present invention will become apparent from the following description read in conjunction with the accompanying drawings, in which like reference numerals designate the same elements.

BRIEF DESCRIPTION OF THE DRAWINGS

FIG. 2 shows a schematic side view of a second design of a press-fit contact element according to the invention.

FIG. 3 shows a schematic side view of a third design of a press-fit contact element according to the invention.

FIGS. 4 and 5 show three-dimensional views of the arrangement of a press-fit contact element according to the invention in a portion of a housing of a power semiconductor module.

DETAILED DESCRIPTION OF THE PREFERRED EMBODIMENTS

Figure 1:
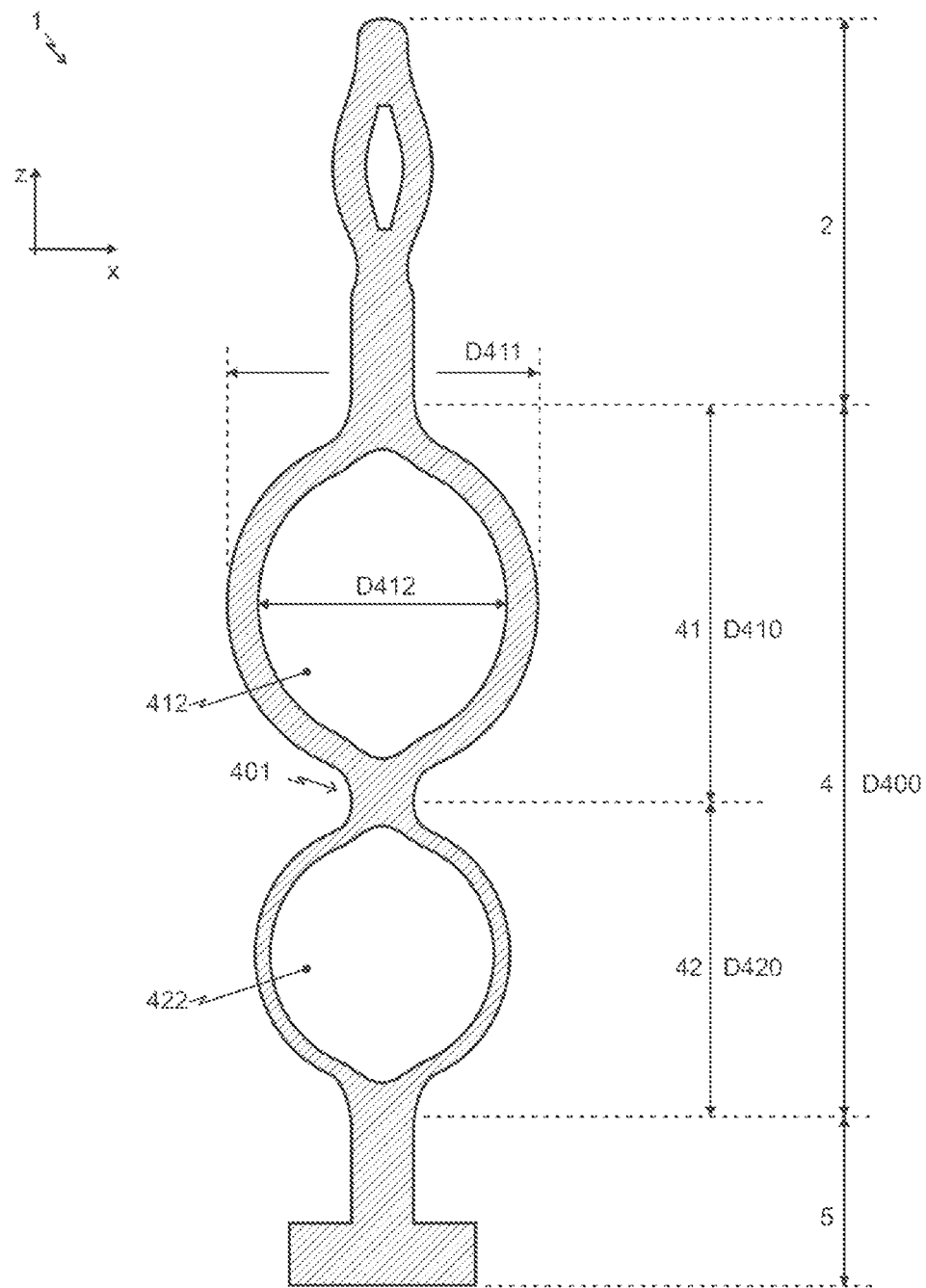
FIG. 1 shows a schematic side view of a first design of a press-fit contact element according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a schematic side view of a first design of a press-fit contact element 1 according to the invention. This design has different portions arranged in a row. The press-fit portion 2 is represented with the actual press-fit area, which may basically be realized in the conventional manner. Adjoining this press-fit portion 2 is the compensating portion 4, which is adjoined by the foot portion 5, which likewise may basically be realized in the conventional manner.

The compensating portion 4 thus extends in a longitudinal direction z of the press-fit contact element 1 and is elastic. For this purpose, the compensating portion 4 has two O-shaped sub-portions 41, 42, which are likewise arranged in succession in the longitudinal direction z, and a first constriction 401 arranged therebetween, which realizes, as it were, a connecting portion between the sub-portions 41, 42.

The press-fit contact element 1 is produced from a flat sheet by means of a stamping or stamping-bending process. Thus, at least the compensating portion 4 is flat and planar and has two mutually parallel and planar main surfaces whose normal vectors run in the y-direction.

The entire compensating portion 4 has a length D400 of approximately 12 mm, the first O-shaped sub-portion 41 adjacent to the press-fit portion 2 having a length D410 of approximately 7 mm, and the second O-shaped sub-portion 42 having a length D420 of approximately 5 mm.

The first O-shaped sub-portion 41 has a width of approximately 5 mm, and the second O-shaped sub-portion 42 has a width of approximately 4.4 mm and is thus narrower than the first O-shaped sub-portion 41. The first O-shaped sub-portion 41 furthermore comprises a recess 412,422,432 having a width of approximately 80% of its width, thus approximately 4 mm.

The recesses 412,422 of the two sub-portions 41,42 arranged in succession are completely separated from each other in the region of the first constriction 401 arranged therebetween.

The compensating portion 4 is resilient, due to its described design. When a force is applied in the negative z-direction to the press-fit portion 2, the two arcs of the respective O-shaped sub-portion 41, 42 are elastically compressed, thus forming a restoring force.

FIG. 2 shows a schematic side view of a second embodiment of a press-fit contact element 1 according to the invention. It is similar to the first design in respect of production technology. In addition, this press-fit contact element 1 has a stop portion 3 between the press-fit portion 2 and the compensating portion 4. This has two laterally projecting flat stop elements 31, 32, the effect of which is described in greater detail in FIG. 5.

FIG. 3 shows a schematic side view of a third embodiment of a press-fit contact element 1 according to the invention. Again, it is similar to the first design in respect of production technology. In addition, this press-fit contact element 1 has a third O-shaped sub-portion 43. The width D411 of the respective O-shaped sub-portions 41, 42, 43 decreases strictly monotonically here, as viewed from the press-fit portion 2, in the direction of the foot portion 5, i.e., in the negative z-direction.

The recesses 412, 422, 423 of the respective sub-portions 41, 42, 43 arranged in succession are completely separated from each other in the region of the first constriction 401, 402 arranged therebetween.

FIGS. 4 and 5 show three-dimensional views of the arrangement of a press-fit contact element 1 according to the invention in a portion of a housing 66 of a power semiconductor module 6. FIG. 4 in this case shows the arrangement in an exploded representation, while FIG. 5 shows the standard representation. The press-fit contact element 1 again has, in this order, a press-fit portion 2, a stop portion 3, a compensating portion 4 and a foot portion 5.

The foot portion 5 here, represented in FIG. 5, is connected in a materially bonded manner to a conductor track 600 of a substrate 60 of a power semiconductor module 6.

The compensating portion 4 has three O-shaped sub-portions 41, 42, 43 which merge directly into one another, with a first constriction being arranged between each two sub-portions. The width of the O-shaped sub-portions, as viewed from the press-fit portion 2, decreases in a strictly monotonic manner in the direction of the foot portion 5.

The course of the first and second O-shaped sub-portions 41, 42 in each case has a V-shaped outer contour 424, in the middle of its arcuate course.

The housing 66 represented in a detail is realized as a plastic molded body and has a channel 660, in which the press-fit contact element 1 is arranged substantially with its compensating portion 4. The channel 660 itself is open on one longitudinal side.

Both narrow sides 662 of the channel 660 likewise have a V-shaped contour 664. This V-shaped contour of the channel corresponds to the V-shaped outer contour 414, 424 of the O-shaped sub-portions 41, 42 of a press-fit contact element 1. Therefore, when the press-fit contact element 1 is arranged in the channel 660, no movement perpendicular to the longitudinal direction, the z-direction, of the press-fit contact element 1 can be affected, the press-fit contact element 1 being thus fixed in this position in both orthogonal directions, i.e., the x- and the y-direction.

In the case of this design, the third sub-portion 43, which also does not have a V-shaped outer contour, is not included in the fixing of the press-fit contact element 1 in the channel 660. This third sub-portion 43, since it can extend in the x-direction, assumes the main proportion of the spring action of the compensating portion 4.

The stop portion 3 is basically realized as described in FIG. 2 and is arranged between the press-fit portion 2 and the compensating portion 4. The stop portion 3 again has two laterally projecting flat stop elements 31, 32, each of which rests on a counter-bearing 666, in this case a surface portion of the housing. This prevents displacement in the negative z-direction when force is applied to the press-fit portion 2 of the press-fit contact element 1 in this direction.

As a result of the press-fit contact element 1 being fixed in the housing 66 by means of the described stop portion 3 and the compensating portion 4, which is also described, the spring action of the compensating section 4 acts here in the case of a relative movement in the z-direction between the substrate 60 and the housing 66.

Figure 6:
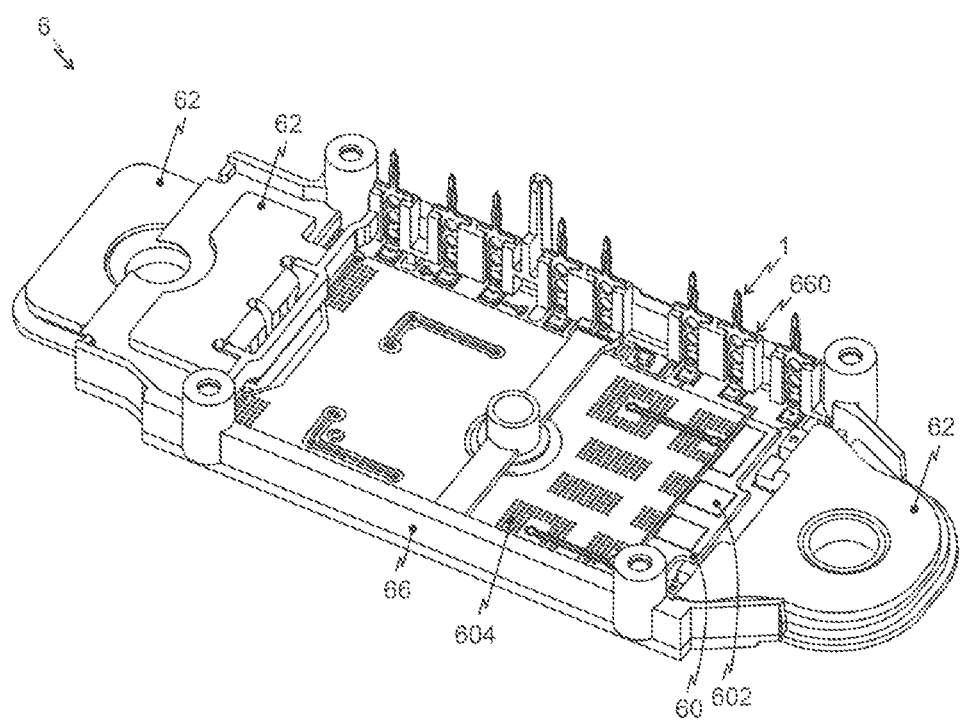
FIG. 6 shows a three-dimensional view of a power semiconductor module according to the invention.

FIG. 6 shows a three-dimensional view of a power semiconductor module 6 according to the invention. This has a housing frame 66 formed from a plastic molded body, as well as power semiconductor components 602 arranged on a substrate 60 and connected by means of a conventional, foil-like connecting means 604. Furthermore, the power semiconductor module 6 comprises load 62 and auxiliary connector elements. The auxiliary connector elements are realized here as the press-fit contact elements 1 described in FIGS. 4 and 5 and are arranged in a row.

The respective press-fit contact elements 1 are arranged in associated channels 660 of the housing frame 66, and are fixed in this position, and thus in a row, and with respect to their respective distances.

Figure 7:
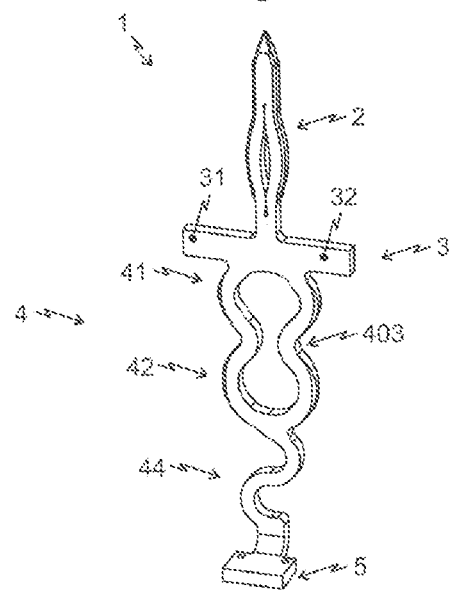
FIG. 7 shows a three-dimensional view of a further press-fit contact element according to the invention.

FIG. 7 shows a three-dimensional view of a further press-fit contact element according to the invention. This differs from the press-fit element according to FIGS. 4 and 5 in that it has a second constriction 403 between the first and second sub-portions, which is realized in such a manner that recesses 412, 422 of the sub-portions 41, 42 arranged in succession merge into one another in the region of this second constriction 403. They thus form a dumbbell-shaped recess common to both sub-portions 41, 42. In addition, the third sub-portion 44 of the compensating portion 4 is realized here as an S shape.

It is to be noted that of course features of different exemplary embodiments of the invention can be combined with one another in an arbitrary manner, unless the features are mutually exclusive, without departing from the scope of the invention.

Also, the inventors intend that only those claims which use the specific and exact phrase "means for" are intended to be interpreted under 35 USC 112, sixth paragraph. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A press-fit contact element, comprising:
   a press-fit portion, a compensating portion and a foot portion;
   the compensating portion being elastic in a longitudinal direction (z) of the press-fit contact element;
   the compensating portion having at least two O-shaped sub-portions that each have a respective recess; and
   at least a first constriction arranged in the longitudinal direction (z) between two successively arranged O-shaped sub-portions.

2. The press-fit contact element, according to claim 1, wherein:
   the recesses of two successively arranged sub-portions being one of (i) completely separated from each other in the region of the first constriction arranged therebetween, and (ii) the recesses of two successively arranged sub-portions merging into one another in the region of the second constriction.

3. The press-fit contact element, according to claim 2, wherein:
the compensating portion is flat and planar.

4. The press-fit contact element, according to claim 3, wherein:
at least two of the O-shaped sub-portions are arranged so as to directly adjoin one another.

5. The press-fit contact element, according claim 4, wherein:
a width of the respective O-shaped sub-portions is decreasing monotonically from the press-fit portion in the direction of the foot portion.

6. The press-fit contact element, according to claim 4, wherein:
an outer contour of at least one O-shaped sub-portion being V-shaped.

7. The press-fit contact element, according to claim 4 wherein:
in a case of at least three O-shaped sub-portions a width of at least one O-shaped sub-portion is at least 20%, of the length of a compensating portion.

8. The press-fit contact element, according to claim 4, wherein:
a stop portion is arranged between the press-fit portion and the compensating portion; and
said stop portion has two laterally protruding flat stop elements.

9. The press-fit contact element according to claim 4, wherein:
at least the compensating portion is formed from a flat having two main surfaces that are arranged parallel to each other and which are planar.

10. The press-fit contact element, according to claim 4, wherein:
in the case of two O-shaped sub-portions a width of at least one of said at least two O-shaped sub-portions is at least 25%, of the length of a compensating portion.

11. The press-fit contact element, according to claim 10, wherein:
the width of the first constriction is at most 30% of the length of the compensating portion; and the width of a second constriction being at most 40%, of the length of the compensating portion.

12. The press-fit contact element, according to claim 10, wherein:
at least one of the O-shaped sub-portions has a recess whose width at its widest point is at least 60% of the O-shaped sub-portion.

13. A power semiconductor module assembly, comprising:
a press-fit contact element according to claim 1; and
said module further comprising;
a substrate and a plurality of power semiconductor components arranged thereon;
said power semiconductor components including a load and an auxiliary connector element;
a plastic molded body, having one of a housing and a housing frame and which has a channel;
channel receiving an arrangement of said compensating portion of said press-fit contact element; and
said channel is one of laterally-closed and at least partially open on one longitudinal side.

14. The power semiconductor module assembly, according to claim 13, wherein:
a sub-portion of the compensating portion of the press-fit contact element is in said channel.

15. The power semiconductor module assembly, according to claim 14, wherein:
at least one narrow side of the channel has a V-shaped contour; and
said V-shaped contour being shaped to accommodate a V-shaped, outer contour of an O-shaped sub-portion of said press-fit contact element.

16. The power semiconductor module assembly, according to claim 14, wherein:
the compensating portion bears against the narrow side of the channel with fewer than all the outer contours of the O-shaped sub-portions.

17. The power semiconductor module assembly, according to claim 14, wherein:
the compensating portion of said press-fit contact element has two stop elements arranged in the channel; and.
said stop elements lying on a counter-bearing of the housing.

* * * * *